(12) United States Patent
Alser et al.

(10) Patent No.: US 10,421,367 B2
(45) Date of Patent: Sep. 24, 2019

(54) ELECTRIC VEHICLE BATTERY TEST

(71) Applicant: Faraday & Future Inc., Gardena, CA (US)

(72) Inventors: John Alser, Newport Beach, CA (US); Douglas D. Chidester, San Pedro, CA (US); Anil Paryani, Cerritos, CA (US); Phillip John Weicker, Los Angeles, CA (US)

(73) Assignee: FARADAY & FUTURE INC., Gardena, CA (US)

( * ) Notice: Subject to any disclaimer, the term of this patent is extended or adjusted under 35 U.S.C. 154(b) by 0 days.

(21) Appl. No.: 15/336,034

(22) Filed: Oct. 27, 2016

(65) Prior Publication Data

US 2017/0120771 A1 May 4, 2017

Related U.S. Application Data

(60) Provisional application No. 62/249,128, filed on Oct. 30, 2015.

(51) Int. Cl.
| | |
|---|---|
| *B60L 1/00* | (2006.01) |
| *B60L 11/18* | (2006.01) |
| *B60K 1/04* | (2019.01) |
| *B60K 7/00* | (2006.01) |
| *G01R 31/00* | (2006.01) |
| *G01R 31/36* | (2019.01) |
| *G01R 31/396* | (2019.01) |
| *B60L 58/21* | (2019.01) |
| *G01R 31/02* | (2006.01) |

(52) U.S. Cl.
CPC .......... *B60L 11/1864* (2013.01); *B60K 1/04* (2013.01); *B60K 7/0007* (2013.01); *B60L 58/21* (2019.02); *G01R 31/006* (2013.01); *G01R 31/3644* (2013.01); *G01R 31/396* (2019.01); *G01R 31/007* (2013.01); *G01R 31/025* (2013.01)

(58) Field of Classification Search
CPC ..... B60L 11/1864; B60K 1/04; B60K 7/0007; G01R 31/006; G01R 31/3644
USPC ........................................................ 180/65.8
See application file for complete search history.

(56) References Cited

U.S. PATENT DOCUMENTS

| | | | | |
|---|---|---|---|---|
| 5,998,884 | A * | 12/1999 | Kitamine ............ | B60L 11/1851 180/65.8 |
| 2003/0044689 | A1* | 3/2003 | Miyazaki .............. | H02J 7/0026 429/320 |
| 2007/0069734 | A1* | 3/2007 | Bertness .............. | G01R 31/007 324/411 |
| 2008/0132378 | A1* | 6/2008 | Bouchon ................. | B60K 6/48 477/3 |
| 2011/0049977 | A1* | 3/2011 | Onnerud ............... | B60L 3/0046 307/9.1 |
| 2011/0101920 | A1* | 5/2011 | Seo ..................... | B60L 11/1861 320/127 |
| 2014/0001986 | A1* | 1/2014 | Fink .................... | H02P 29/0033 318/139 |

(Continued)

*Primary Examiner* — Hau V Phan
(74) *Attorney, Agent, or Firm* — Knobbe Martens Olson & Bear LLP (57) ABSTRACT

An adaptive and adjustable isolation fault testing of a multi-string battery of an electric vehicle is disclosed. The isolation fault testing can be performed in an adjustable or predetermined loop having dedicated time windows for respective battery strings in compliance with the system requirements, specification, and regulatory regime.

17 Claims, 4 Drawing Sheets

(56) References Cited

U.S. PATENT DOCUMENTS

| | | | | |
|---|---|---|---|---|
| 2014/0035361 | A1* | 2/2014 | Schmidt | B60L 11/1803 |
| | | | | 307/10.1 |
| 2014/0084914 | A1* | 3/2014 | Nakajima | G01R 33/09 |
| | | | | 324/252 |
| 2014/0358350 | A1* | 12/2014 | Schmidt | B60L 3/0046 |
| | | | | 701/22 |
| 2015/0109020 | A1* | 4/2015 | Morino | G01R 19/0092 |
| | | | | 324/764.01 |
| 2015/0219696 | A1* | 8/2015 | Eckrich | G01R 31/006 |
| | | | | 324/503 |
| 2015/0236384 | A1* | 8/2015 | Nakayama | H01M 10/052 |
| | | | | 429/91 |
| 2016/0091551 | A1* | 3/2016 | Sun | G01R 31/025 |
| | | | | 701/34.2 |
| 2016/0252556 | A1* | 9/2016 | Kawanaka | G01R 31/006 |
| | | | | 324/549 |
| 2017/0072811 | A1* | 3/2017 | Tabatowski-Bush | |
| | | | | B60L 11/1864 |
| 2017/0102435 | A1* | 4/2017 | Hanking | G01R 31/3658 |

\* cited by examiner

ELECTRIC VEHICLE BATTERY TEST

RELATED APPLICATIONS

This application claims the benefit of U.S. Provisional Application Ser. No. 62/249,128, filed on Oct. 30, 2015, entitled "ELECTRIC VEHICLE BATTERY TEST," which is hereby incorporated by reference in its entirety and for all purposes.

BACKGROUND

Field

The described technology generally relates to automobiles, more specifically, to batteries.

Description of the Related Art

Managing a power source in an automobile, such as an electric vehicle, can be challenging as balancing the appropriate level of power, efficiency, and reliability can be difficult. A battery pack sourcing power to an electric vehicle, for example, can suffer from internal or external failures that may result in inability to support critical load or provide sufficient current as required by the vehicle system.

SUMMARY

The methods and devices of the described technology each have several aspects, no single one of which is solely responsible for its desirable attributes.

In one implementation, an electric vehicle comprises a motor coupled to one or more wheels of the electric vehicle, an inverter coupled to the motor, and at least a first power bus coupled to the inverter. A first battery string has an output that is coupled to the first power bus through a first switch. A second battery string different from the first battery string has an output that is coupled to the first power bus through a second switch different from the first switch. A battery management circuit is coupled to at least the first switch and the second switch. The battery management circuit is configured to selectively and independently control the open or closed state of the first switch and the second switch. The battery management system is further configured to perform isolation fault testing on the first battery string and the second battery string in different time windows.

In another implementation, a method of isolation fault testing a plurality of battery strings in an electric vehicle comprises disconnecting a first battery string from a power bus of the electric vehicle, performing an isolation fault test on the first battery string, and reconnecting the first battery string to the power bus. While the first battery string remains connected to the power bus, disconnecting a second battery string from the power bus of the electric vehicle, and performing an isolation fault test on the second battery string.

BRIEF DESCRIPTION OF THE DRAWINGS

These drawings and the associated description herein are provided to illustrate specific embodiments of the invention and are not intended to be limiting.

DETAILED DESCRIPTION

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to automotive systems and/or different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An adaptive and adjustable isolation fault testing of a multi-string battery of an electric vehicle is disclosed. The isolation fault testing can be performed in an adjustable or predetermined loop having dedicated time windows for respective battery strings in compliance with the system requirements, specification, and regulatory regime.

Figure 1:
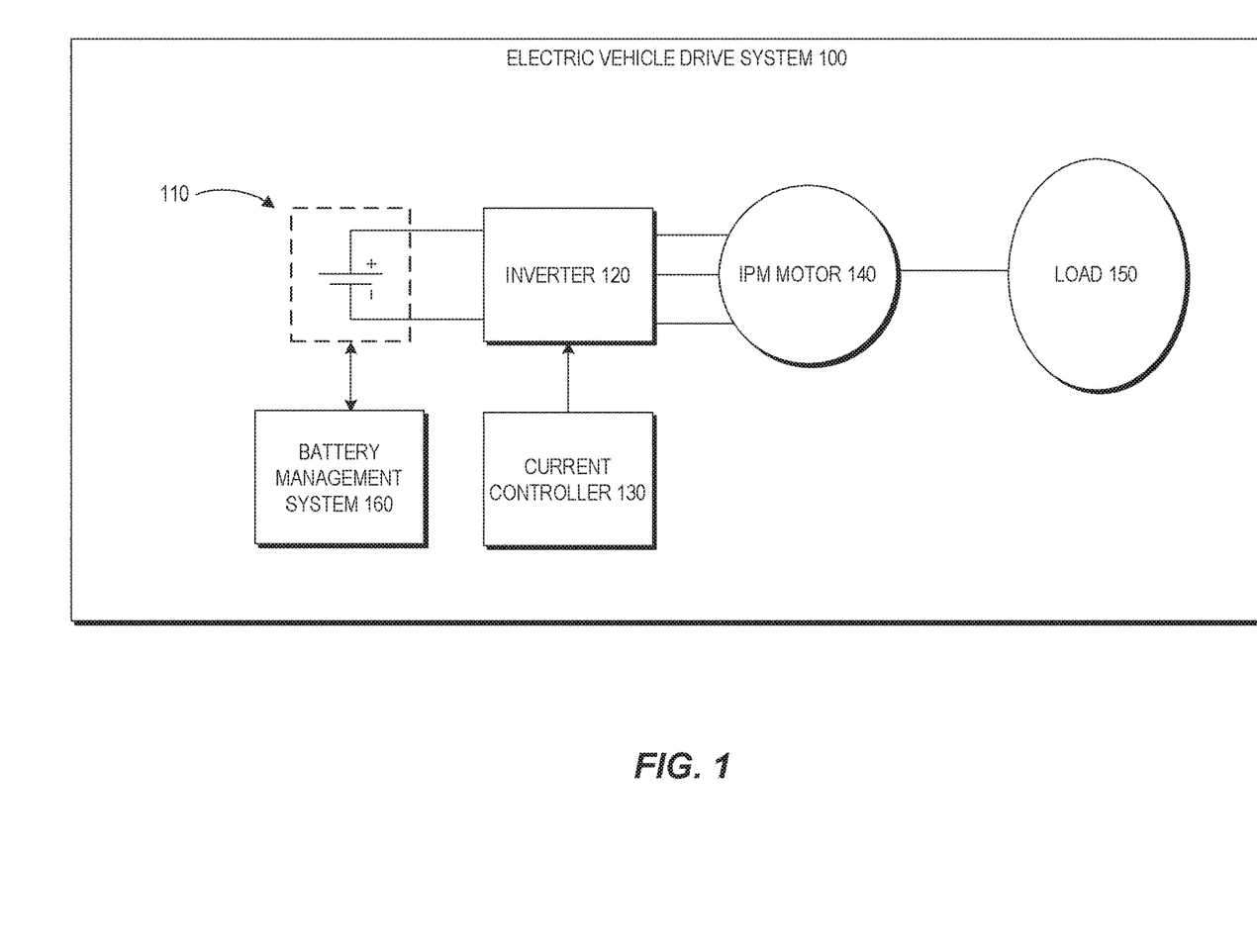
FIG. 1 is a block diagram of an example electric vehicle drive system according to one embodiment.

FIG. 1 depicts a block diagram of an example electric vehicle drive system 100 including a battery management system 160 as described herein. The electric vehicle drive system 100 includes the battery or voltage source 110, an inverter 120 coupled to the battery 110, a current controller 130, a motor 140, and load 150, and the battery management system 160. The battery 110 can be a single phase direct current (DC) source. In some embodiments, the battery 110 can be a rechargeable electric vehicle battery or traction battery used to power the propulsion of an electric vehicle including the drive system 100. Although the battery 110 is illustrated as a single element in FIG. 1, the battery 110 depicted in FIG. 1 is only representational, and further details of the battery 110 are discussed below in connection with FIG. 2.

The inverter 120 includes power inputs which are connected to conductors of the battery 110 to receive, for example, DC power, single-phase electrical current, or multi-phase electrical current. Additionally, the inverter 120 includes an input which is coupled to an output of the current controller 130, described further below. The inverter 120 also includes three outputs representing three phases with currents that can be separated by 120 electrical degrees, with each phase provided on a conductor coupled to the motor 140. It should be noted that in other embodiments inverter 120 may produce greater or fewer than three phases.

The motor 140 is fed from voltage source inverter 120 controlled by the current controller 130. The inputs of the motor 140 are coupled to respective windings distributed about a stator. The motor 140 can be coupled to a mechanical output, for example a mechanical coupling between the motor 140 and mechanical load 150. Mechanical load 150 may represent one or more wheels of the electric vehicle.

Controller 130 can be used to generate gate signals for the inverter 120. Accordingly, control of vehicle speed is performed by regulating the voltage or the flow of current from the inverter 120 through the stator of the motor 140. There are many control schemes that can be used in the electric vehicle drive system 100 including current control, voltage control, and direct torque control. Selection of the characteristics of inverter 120 and selection of the control technique of the controller 130 can determine efficacy of the drive system 100.

The battery management system 160 can receive data from the battery 110 and generate control signals to manage the battery 110, including performing isolation tests as disclosed herein. Further details of the battery management system 160 are discussed in connection with FIGS. 2-4 below.

Although not illustrated, the electric vehicle drive system 100 can include one or more position sensors for determining position of the rotor of the motor 140 and providing this information to the controller 130. For example, the motor 140 can include a signal output that can transmit a position of a rotor assembly of the motor 140 with respect to the stator assembly motor 140. The position sensor can be, for example, a Hall-effect sensor, potentiometer, linear variable differential transformer, optical encoder, or position resolver. In other embodiments, the saliency exhibited by the motor 140 can also allow for sensorless control applications. Although not illustrated, the electric vehicle drive system 100 can include one or more current sensors for determining phase currents of the stator windings and providing this information to the controller 130. The current sensor can be, for example, a Hall-effect current sensor, a sense resistor connected to an amplifier, or a current clamp.

It should be appreciated that while the motor 140 is depicted as an electrical machine that can receive electrical power to produce mechanical power, it can also be used such that it receives mechanical power and thereby converts that to electrical power. In such a configuration, the inverter 120 can be utilized to excite the winding using a proper control and thereafter extract electrical power from the motor 140 while the motor 140 is receiving mechanical power.

Figure 2:
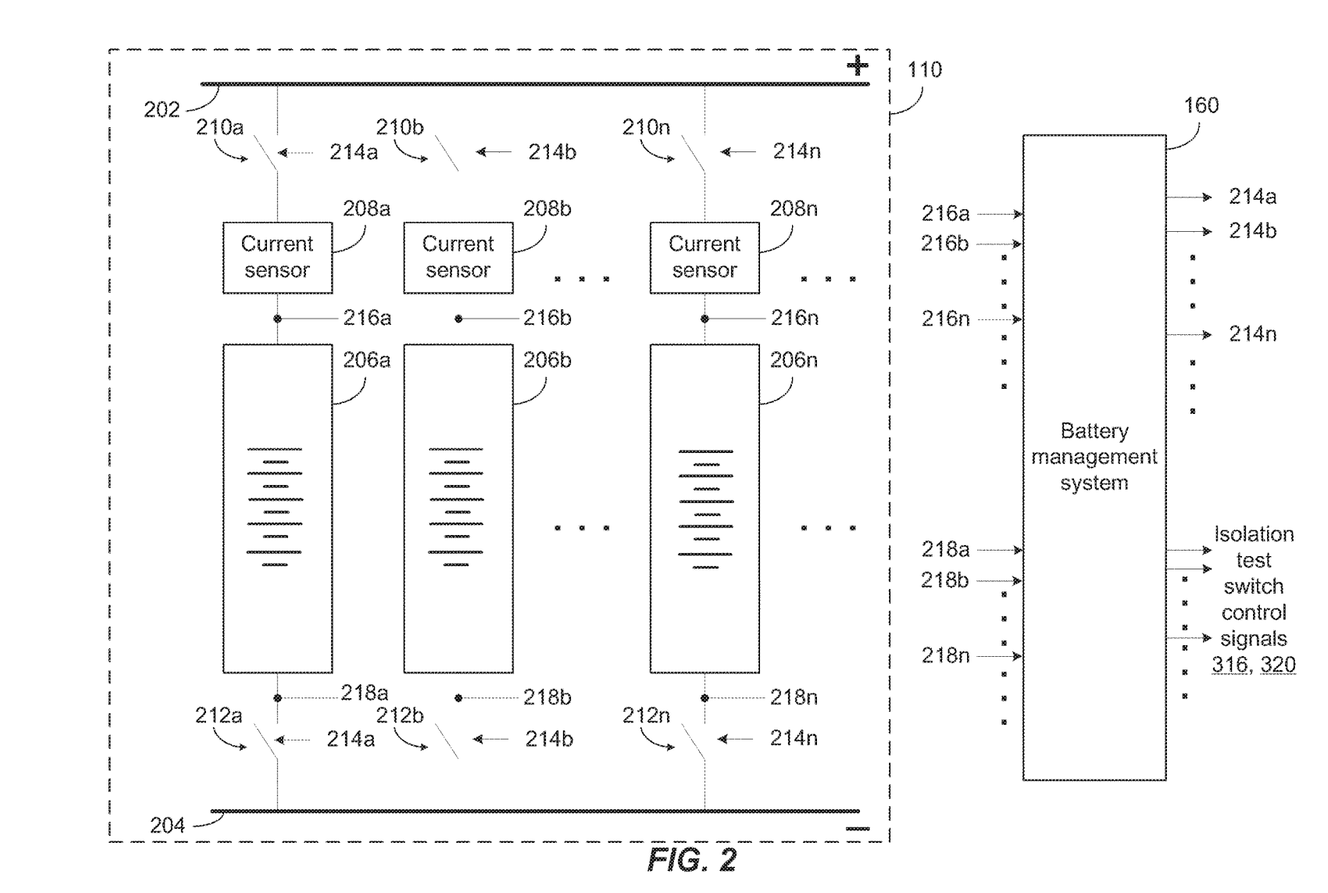
FIG. 2 is a block diagram of example voltage source and battery management system according to one embodiment.

FIG. 2 is a block diagram of example voltage source and battery management system. As illustrated in FIG. 2, the battery management system 160 can receive a plurality of voltage measurements at various nodes within the voltage source 110 and generate a plurality of control signals to open or close switches within the voltage source 110. The voltage source 110 can include a plurality of battery strings 206a, 206b, . . . 206n, . . . , individually or collectively referred to herein as the battery string(s) 206, and a plurality of current sensors 208a, 208b, . . . , 208n, . . . , individually or collectively referred to herein as the current sensor(s) 208. The battery strings 206 can be individually connected to or disconnected from a positive or high power bus 202 and a negative or low power bus 204 through a plurality of switches 210a, 210b, . . . , 210n, . . . , and 212a, 212b, . . . , 212n, . . . , individually or collectively called the switches 210 and 212. The switches 210 and 212 can be controlled by control signals from a battery management system 160.

The battery management system 160 can receive, among others, voltages between various nodes of the battery strings 206 and an isolated (or supposedly isolated) ground, such as the chassis ground. Positive string nodes 216a, 216b, . . . , 216n, . . . , individually or collectively referred to herein as the positive string node(s) 216 can be the respective positive terminals of the battery strings 206. Negative string nodes 218a, 218b, . . . , 218n, . . . , individually or collectively referred to herein as the negative string node(s) 218, can be the respective negative terminals of the battery strings 206. Based at least in part on the voltages between the positive string nodes 216 and the chassis ground or voltages between the negative string nodes 218 and the chassis ground, the battery management system 160 can determine and localize internal or external faults to the battery strings 206 or circuits connected to the battery strings 206. To perform isolation test as disclosed herein, the battery management system 160 can generate one or more of connect control signals 214a, 214b, . . . , 214n, . . . , individually or collectively referred to herein as the connect control signal(s) 214, for controlling the respective switches 210 and 212. The battery management system 160 can also generate a plurality of isolation test control signals 316, 320. The battery management system 160 and the isolation test control signals 316, 320 are discussed in detail in connection with FIG. 3 below.

The battery strings 206 can include a plurality of modules, each of which in turn can include a plurality of cells. For example, in one embodiment, about one hundred cells can be in one module, and about 13 modules can be in one battery string. Within each battery string 206, the constituent modules and cells can be connected in series as symbolically depicted in FIG. 2. In some embodiments, the voltage source 110 can include six battery strings 206 that can be connected to or disconnected from the power buses 202, 204. The battery strings 206 can be implemented with various different types of rechargeable battery cells made of various materials, such as lead acid, nickel cadmium, lithium ion, or other suitable materials. In some embodiments, each of the battery strings can output about 375V-400V if charged about 80% or more.

The current sensors 208 can be connected in series with the respective battery strings 206 between the high and low power buses 202, 204. As shown in FIG. 2 the current sensor 208 can be connected to the positive side of the respective battery strings 206 to measure the current discharged from the battery strings 206. In other embodiments, the current sensors 208 can be connected to the battery strings 206 otherwise to measure the current flow due to discharging of the battery strings 206.

The switches 210 and 212 can be contactors configured to connect the battery strings 206 to the power buses 202, 204 or disconnect the battery strings 206 from the power buses 202, 204 in response to the respective connect control signals 214. The switches 210 can be implemented with any suitable contactors capable of handling the level of current and voltage as needed in connection with, for example, the battery strings 206, the power buses 202, 204, and the load 150 (FIG. 1) within the electric vehicle drive system 100 (FIG. 1). Although in the illustrated example in FIG. 2, the switches 210 (e.g., 210n) and the switches 212 (e.g., 212n) are controlled by the same respective control signals 214 (e.g., 214n), in other embodiments, the switches 210 (e.g., 210n) can be controlled by respective positive bus connect control signals while the switches 212 (e.g., 212n) can be controlled by respective negative bus connect control signals.

Figure 3:
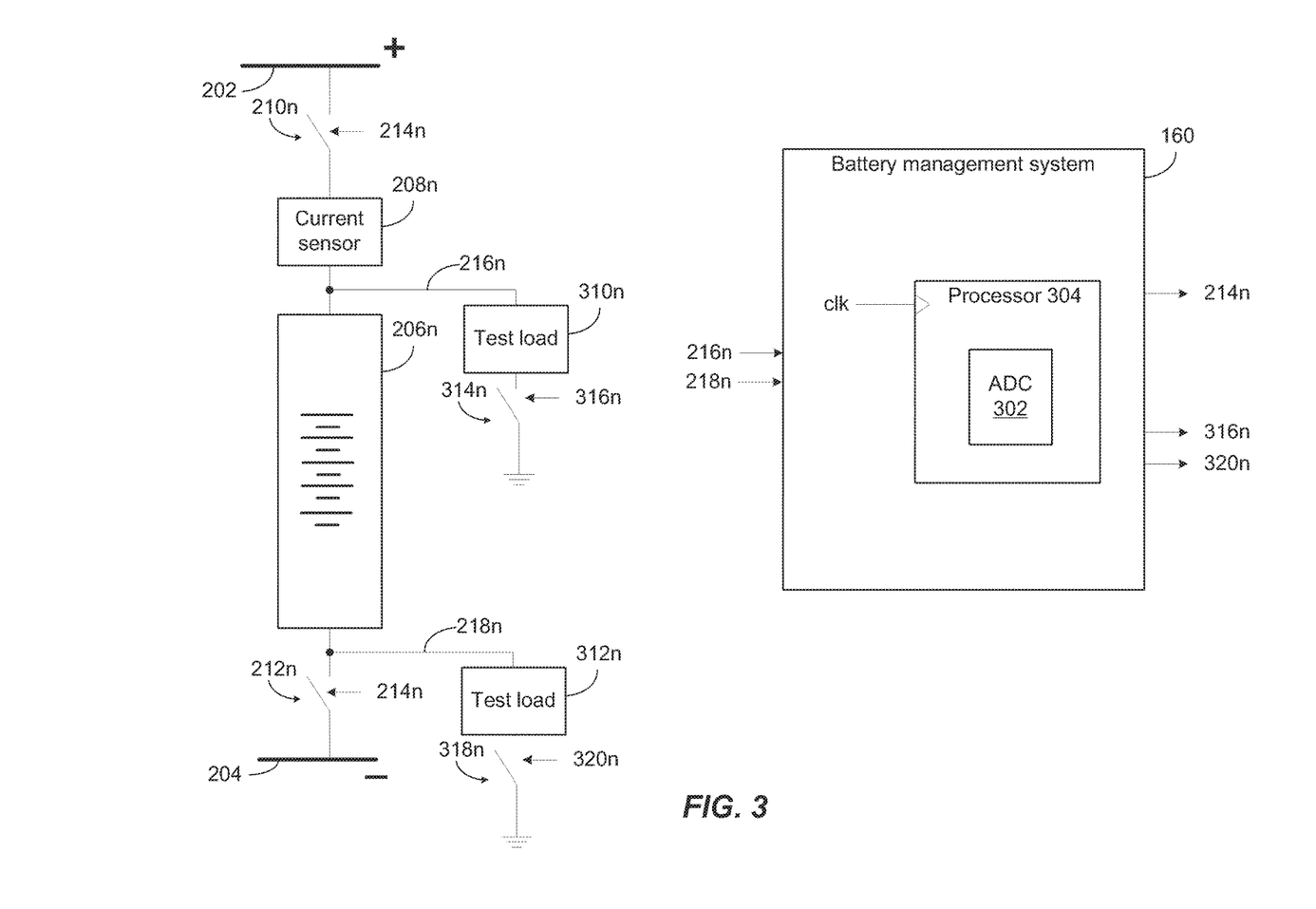
FIG. 3 is another block diagram of example voltage source and battery management system according to one embodiment.

FIG. 3 is another block diagram of example voltage source and battery management system according to one embodiment. In FIG. 3, one exemplary battery string 206n of the plurality of battery strings 206 of FIG. 2 is illustrated, and accordingly, the corresponding current sensor 208n, switches 210n, 212n, connect control signal 214n, positive string node 216n, and negative string node 218n are illustrated. As illustrated in FIG. 3, the positive string node 216n can be coupled to a test load 310n and a test load switch 314n to the chassis ground, and similarly the negative string node 218n can be coupled to another test load 312n and another test load switch 318n to the chassis ground. Although not specifically illustrated, it is to be noted that the battery strings 206a, 206b, . . . , 206n, . . . of FIG. 2 can be accompanied with their respective test loads 310a, 310b, . . . , 310n, . . . , test load switches 314a, 314b, . . . , 314n, . . . , test loads 312a, 312b, . . . 312n, . . . , and test load switches 318a, 318b, . . . , 318n, . . . at their respective positive and negative string nodes 216 and 218. The test loads 310 and 312 can be implemented with a known load with a known impedance, and the test load 310 for the positive string node 216 and the test load 312 for the negative string node 218 can be substantially same or different depending on the particular voltage source 110 and the overall drive system 100. In some embodiments, the loads 310 and 312 can be, for example, a series of resistors whose total resistance can be about several mega ohms. The test load switches 314 and 318 can be controlled by the isolation test control signals 316 (e.g., 316n) and 320 (e.g., 320n), which are outputted from the battery management system 160. In some embodiments, the switches 314, 318 can be implemented with relays. Although the load switches 314 and 318 are depicted as a single switch in FIG. 3, it can be noted that the load switches 314 and 318 can be implemented with various functionally similar one or more of circuit elements.

The battery management system 160 can include an analog-to-digital converter (ADC) 302 and a processor 304. In some embodiments, the ADC 302 can be internal to the processor 304, and in other embodiments, the ADC 302 can be separate from the processor 304. The battery management system 160 can also include a plurality of passive and/or active circuit elements, amplifiers, buffers, drivers, regulators, or other suitable components. The battery management system 160 can also have different ground potentials for different operations. For example, the battery management system 160 may have different grounds for certain filters, analog circuit components, digital circuit components, and/or isolation tests. In some embodiments, the isolation test disclosed herein can be performed using the chassis ground to determine whether there is an internal or external fault to the battery strings 206 or the circuits connected to the battery strings 206. In some embodiments, the battery management system 160 can also include one or more components for communicating and sending and receiving data with other circuitries in the electric vehicle. For example, the various components and circuits within the system 100, including components in the battery management system 160 can be in communication with one another using protocols or interfaces such as a CAN bus. And in some embodiments, the processing of incoming data can be at least in part performed by other components not in the battery management system 160 within the electric vehicle as the battery management system 160 communicates with other components.

The battery management system 160 can control the connect control signal 214 and the test control signals 316, 320 and can receive the voltage at the positive string node 216 and the negative string node 218 to determine internal battery fault or external circuit fault. As further discussed below in connection with FIG. 4, the processor 304 can control the timing and interval of opening and closing of the switches 210, 212, 314, and 318 of the individual battery strings 206.

Figure 4:
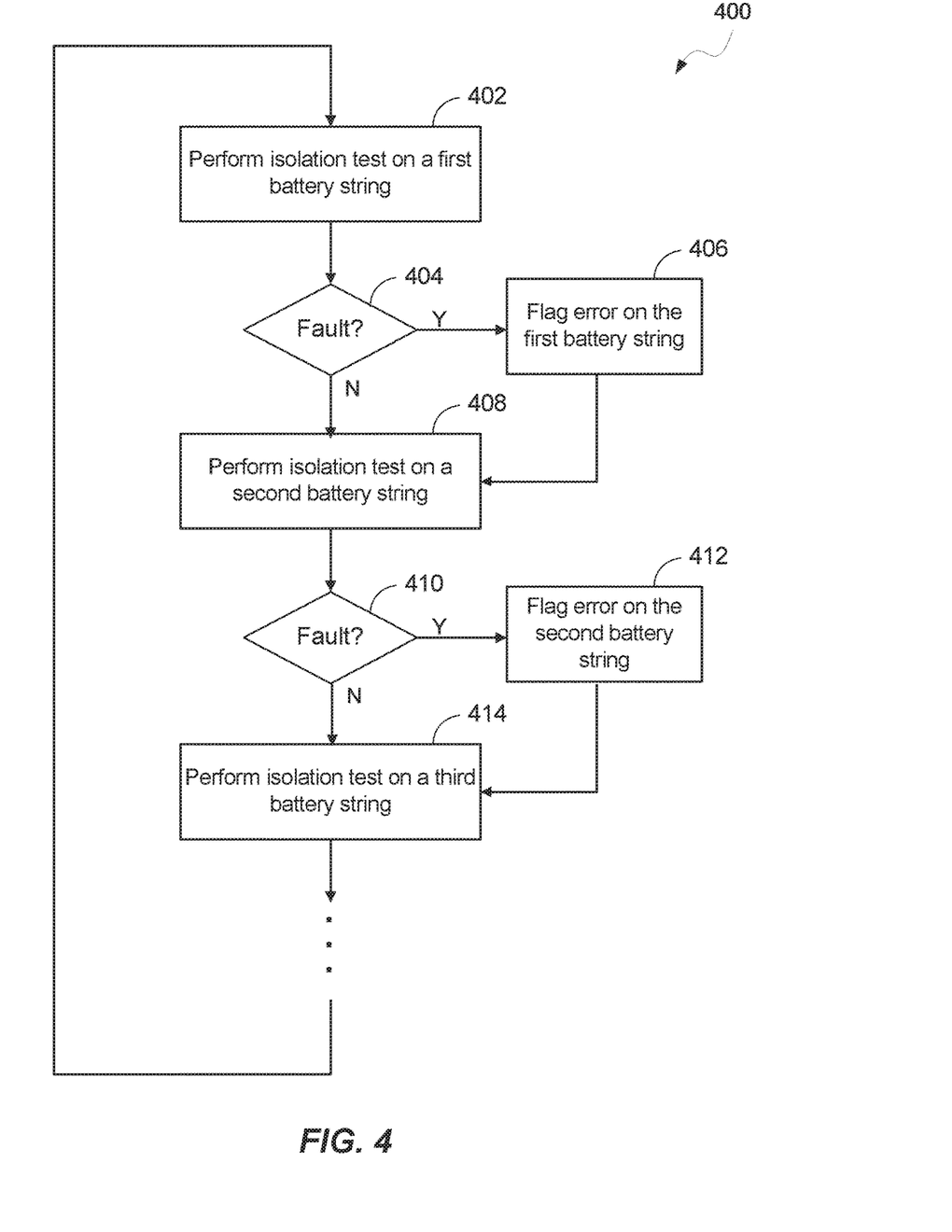
FIG. 4 is a flowchart of an example battery test process according to one embodiment.

FIG. 4 is a flowchart of an example battery test process according to one embodiment. The illustrated process 400 can be performed at least in part by and/or in conjunction with, for example, the battery management system 160 (FIGS. 2-3), the processor 304 (FIG. 3), the ADC 302 (FIG. 3), the current sensors 208 (FIGS. 2-3), voltage sensors, and other similar sensors. It is to be noted that all or parts of steps 402, 404, 406, 408, 410, 412, 414, . . . may be concurrently, continuously, periodically, intermittently, repeatedly, or iteratively performed, and the illustrated process in FIG. 4 is only one example of the disclosed herein according to one embodiment.

In step 402, isolation test can be performed on a first battery string. In some embodiments, isolation testing of the first battery string can be performed to determine the type of fault (internal or external) and the location of the fault. For example, for external isolation fault testing, for each battery string, the positive string node 216 can tested with the known test load 310 with the battery string 206 connected to and disconnected from the power buses 202, 204. Similarly, the negative string node 218 can be tested with the known test load 312 with the battery string 206 connected to and disconnected from the power buses 202, 204. The battery management system 160 or the processor 304 can include one or more memory units (not shown) to store the voltage measurements at the positive and negative string nodes 216, 218 under the various connection conditions, and the stored voltage measurements can be compared to each other or one or more expected voltage readings to determine whether there is an internal or external isolation fault and where the fault is occurring, if any.

For example, the processor 304 can send the isolation test control signal 316 (FIG. 3) to close the switch 314 (FIG. 3) to connect the positive string node 216 to the test load 310 to the chassis ground. The battery management system 160 can receive the voltage measurement between the positive string node 216 and the chassis ground. The voltage at the positive string node 216 can be processed through one or more circuits and the ADC 302, and the processor 304 can determine whether the voltage received is close to the expected voltage based on the test load 310. The processor 304 can also control the connect control signal 214 to disconnect the battery string 206 from the power buses 202, 204 when, for example, a potential fault is detected at the positive string node 216. Similar switch signals 214 and 320 can be sent from the processor 304 in testing the negative string node 218. It is to be noted that as discussed above, step 402 may include sub routines within the step in making various connections, taking responsive measurements, and processing and storing the measurements to determine and categorize isolation faults, if any.

In step 404, it is determined whether a fault was detected from the isolation test of the first battery string. As discussed above in step 402, internal or external fault can be detected by comparing the measurements received by the battery management system 160 with each other (e.g., switches 210, 212 closed or open) and/or with expected measurement values based on known variables (e.g. test loads 310, 312). Furthermore, in some embodiments, based on the voltage level of the faulty voltage, the fault can be localized. If a fault is detected the process 400 proceeds to step 406. If no fault is detected, the process proceeds to step 408.

In step 406, an error is indicated that there is a fault associated with the first battery string. If a fault is detected, the processor 304 may flag that there is a fault associated with the first battery string. If determined, the processor 304 may further indicate the type of the fault (e.g., internal or external) and/or the location of the fault. In some embodiments, the processor 304 may gather, store, and/or transfer data relevant to fault determination for further later processing or for processing by other processing units either within or external to the battery management system 160. Also in some embodiments, the processor 304 can communicate the fault status with other circuitry or subsystems to the drive system 100 or the electric vehicle so that further remedial action can be executed in response to detection of one or more faults.

As described herein, it is to be noted that the steps similar to the steps 402, 404, and 406 discussed above can be performed for each battery string 206 of the voltage source 110. In some embodiments, the testing of each battery strings are timed in a round-robin style. For example, a predetermined, dedicated time window can be assigned to each battery string for the testing and fault determination, and in between the testing time window, there can be intentional delay windows to allow settling of the system after the string testing period, which may involve connecting and disconnecting of the batter strings 206 and loads 310, 312. It can be advantageous to allow the timed management of the isolation tests of the battery strings 206 in an electric vehicle since the timed management can be implemented with a digital control schemes using, for example, the processor 304, which allows adjusting the window length, the order of isolation testing of the battery strings 206, and other relevant timing or ordering parameters as needed by system requirements or specification, in response to changing vehicle operation conditions, and in compliance with various regulatory regimes or industry standards. Furthermore, the managing the timing of the battery string isolation test as disclosed herein can allow instant identification of the battery string associated with the fault since the processor 304 can be configured to manage isolation test timing with assigned or dedicate window for each string. Similarly, using other a priori knowledge built in the system and changing environmental factors can be used to further refine, adjust the timing and ordering of the isolation testing either periodically, dynamically, repeatedly, or on an ad-hoc basis. For example, if a potential fault is detected on a particular battery string, the dynamic adjustment of the timing and ordering the isolation test disclosed herein can allow adjusting the test timing and order of the battery strings so that further testing can be performed (continuously or in an interleaved manner) on the particular battery string identified as potentially faulty.

In step 408, isolation test can be performed on a second battery string. The isolation test of the second battery string can be substantially similar to the isolation test performed on the first battery string discussed above in connection with step 402.

In step 410, fault detection is performed on the second battery string. The fault detection at the second battery string is substantially similar to the fault detection performed on the first battery string discussed above in connection with step 404.

In step 412, error indication is performed with respect to the second battery. The error indication on the second battery string is substantially similar to the error indication on the first battery string discussed above in connection with step 406.

In step 414, isolation test can be performed on a third battery string. As discussed above in connection with steps 402 and 408, the isolation test of the third battery string can be substantially similar to the isolation test performed on the first and the second battery string. After repeating the similar testing, fault detecting, and error indicating steps for all the battery strings 206, the process 400 may loop back to step 402 to test the first battery string.

The features disclosed herein can be implemented in compliance with government safety standards and regulations, such as Federal Motor Vehicle Safety Standard (FMVSS) 305, or industry standards, such as automotive standards set by the Society of Automotive Engineers (SAE).

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules, and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Applications

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. An electric vehicle comprising:
a motor coupled to one or more wheels of the electric vehicle; an inverter coupled to the motor; a first power bus coupled to the inverter; and
a first battery string having an output that is coupled to the first power bus through a first switch,
a second battery string different from the first battery string having an output that is coupled to the first power bus through a second switch different from the first switch;
for each of the first and second battery string:
a first test load with a known impedance connected to a positive node of the respective battery string and a second test load with a known impedance connected to a negative node of the respective battery string; and
a battery management circuit coupled to at least the first switch and the second switch, the battery management circuit configured to selectively and independently control the open or closed state of the first switch and the second switch, the battery management circuit further configured to perform isolation fault testing by:
performing testing steps including: during a first predetermined time window of a timeframe, determining an isolation status of the first battery string, during a second predetermined time window of the timeframe, determining an isolation status of the second battery string, calculating a new time window value based on the isolation status of the first battery string, and setting the first predetermined time window to the new time window value; and
repeating the testing steps;
wherein the isolation status of each of the first and second battery strings is determined by:
comparing a first voltage measurement across the first test load between the positive node and a chassis ground of the electric vehicle with a first expected voltage based on the impedance of the first test load; and
comparing a second voltage measurement across the second test load between the negative node and the chassis ground of the electric vehicle with a second expected voltage based on the impedance of the second test load.

2. The electric vehicle of claim 1, wherein the battery management circuit is configured to perform isolation fault testing while the inverter is drawing current from the first power bus.

3. The electric vehicle of claim 2, wherein the battery management circuit is configured to determine an isolation status of a battery pack including the first battery string and the second battery string, the isolation status of the battery pack being determined based at least in part on the isolation status of the first battery string and the isolation status of the second battery string.

4. The electric vehicle of claim 1, further comprising at least one test current path coupled to each battery string and switchably connected to a chassis of the electric vehicle, each test current path comprising a test load.

5. The electric vehicle of claim 4, further comprising current detection circuitry coupled to the battery management circuit and configured to measure a current flowing through a test current path, wherein the current detection circuitry is configured to send measured current information to the battery management circuit.

6. The electric vehicle of claim 5, wherein the isolation fault testing comprises comparing the measured current information to at least one of predetermined information associated with a normal condition and predetermined information associated with a fault condition.

7. The electric vehicle of claim 1, wherein the battery management circuit is configured to perform the isolation fault testing for each battery string during one of a plurality of predetermined dedicated testing time windows including the first and second predetermined time windows.

8. The electric vehicle of claim 7, wherein the battery management circuit is further configured to implement an intentional delay time window between consecutive testing time windows.

9. A method of testing a plurality of battery strings in an electric vehicle comprising:
performing a battery test, the battery test steps comprising:
disconnecting a first battery string from a power bus of the electric vehicle;
during a first predetermined time window within a timeframe, determining an isolation status of the first battery string by performing an isolation fault test on the first battery string;
reconnecting the first battery string to the power bus;
while the first battery string remains connected to the power bus, disconnecting a second battery string from the power bus of the electric vehicle;
during a second predetermined time window within the timeframe, determining an isolation status of the second battery string by performing an isolation fault test on the second battery string;
calculating a new time window value different from the first predetermined time window based on the isolation status of the first battery string;

setting the first predetermined time window to the new time window value; and repeating the steps of the battery test;

wherein performing the isolation fault test on each tested battery string comprises:

comparing a first voltage measurement across a first test load between a positive node of the tested battery string and a chassis ground of the electric vehicle with a first expected voltage based on a known impedance of the first test load;

comparing a second voltage measurement across a second test load between a negative node of the tested battery string and the chassis ground of the electric vehicle with a second expected voltage based on a known impedance of the second test load.

10. The method of claim 9, wherein the isolation fault tests are performed during operation of the electric vehicle.

11. The method of claim 9, further comprising determining an isolation status of a battery pack including the first battery string and the second battery string, the isolation status of the battery pack being determined based at least in part on the isolation status of the first battery string and the isolation status of the second battery string.

12. The method of claim 9, wherein at least one additional battery string is connected to the power bus while the first battery string is disconnected.

13. The method of claim 9, wherein the isolation fault test is performed on each tested battery string during one of a plurality of a-predetermined dedicated testing time windows including the first and second predetermined time windows.

14. The method of claim 13, wherein consecutive testing time windows are separated by an intentional delay time window.

15. The method of claim 9, wherein, upon repeating the steps of the battery test, the second predetermined time window is not changed.

16. The method of claim 9, wherein the battery test steps further comprise: calculating a second new time window value based on the new time window value, and setting the second predetermined time window to the second new time window value.

17. The method of claim 16, wherein, upon repeating the battery test steps, the order of determining an isolation status of the first battery string and determining the isolation status of the second battery string are reversed.

* * * * *